United States Patent
Shieh et al.

(10) Patent No.: US 6,297,168 B1
(45) Date of Patent: Oct. 2, 2001

(54) EDGE DEFECT INHIBITED TRENCH ETCH PLASMA ETCH METHOD

(75) Inventors: Jyu-Horng Shieh, Hsin-Chu; Jen-Cheng Liu, Chia-Yi; Chao-Cheng Chen, Matou; Li-Chi Chao, Yang-mei; Chia-Shia Tsai, Hsin-Chu, all of (TW)

(73) Assignee: Taiwan Semiconductor Manufacturing Company, Ltd, Hsin Chu (TW)

( * ) Notice: Subject to any disclaimer, the term of this patent is extended or adjusted under 35 U.S.C. 154(b) by 0 days.

(21) Appl. No.: 09/677,068

(22) Filed: Sep. 29, 2000

(51) Int. Cl.$^7$ ...................... H01L 21/3065; H01L 21/306
(52) U.S. Cl. ........................ 438/723; 438/710; 438/706
(58) Field of Search .................................. 438/630, 634, 438/637, 689, 706, 710, 723

(56) References Cited

U.S. PATENT DOCUMENTS

| | | | |
|---|---|---|---|
| 5,811,357 | * 9/1998 | Armacost et al. | 438/723 |
| 5,904,566 | * 5/1999 | Tao et al. | 438/689 |
| 5,935,873 | 8/1999 | Spuler et al. | |
| 6,009,830 | 1/2000 | Li et al. | |
| 6,165,898 | * 12/2000 | Jang et al. | 438/638 |

* cited by examiner

*Primary Examiner*—Amir Zarabian
*Assistant Examiner*—Beth E. Owens
(74) *Attorney, Agent, or Firm*—Tung & Associates

(57) ABSTRACT

Within a method for etching a trench within a silicon oxide layer there is first provided a substrate. There is then formed over the substrate a silicon oxide layer. There is then formed over the silicon oxide layer a masking layer. There is then etched, while employing a plasma etch method in conjunction with the masking layer as an etch mask layer, the silicon oxide layer to form an etched silicon oxide layer defining a trench. Within the method, the plasma etch method employs an etchant gas composition comprising: (1) octafluorocyclobutane; and (2) at least one of carbon tetrafluoride, difluoromethane, hexafluoroethane and oxygen; but excluding (3) a carbon and oxygen containing gas.

14 Claims, 2 Drawing Sheets

EDGE DEFECT INHIBITED TRENCH ETCH PLASMA ETCH METHOD

BACKGROUND OF THE INVENTION

1. Field of the Invention

The present invention relates generally to plasma etch methods for etching trenches within silicon oxide dielectric layers. More particularly, the present invention relates to plasma etch methods for etching, with uniform and optimal etch properties, trenches within silicon oxide dielectric layers.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become increasingly common in the art of microelectronic fabrication to fabricate microelectronic fabrications while employing self-aligned methods. Self-aligned methods are desirable in the art of microelectronic fabrication for fabricating microelectronic fabrications insofar as self-aligned methods provide microelectronic fabrications which may be fabricated with a minimal number of photolithographic process steps, which in turn provides for a minimal number of photolithographic registration tolerances and possible misalignments within a series of microelectronic structures which are formed when fabricating a microelectronic fabrication while employing a self-aligned method.

Of the self-aligned microelectronic structures which may be fabricated while employing self-aligned methods, self-aligned contact microelectronic structures, including but not limited to dual damascene trench self aligned contact microelectronic structures, are particularly common in the art of microelectronic fabrication. To facilitate their fabrication, self-aligned contact microelectronic structures typically employ at least one silicon nitride etch stop layer masking at least one microelectronic structure within a microelectronic fabrication, in conjunction with a silicon oxide dielectric layer passivating the at least one microelectronic structure and the at least one silicon nitride etch stop layer, wherein the silicon oxide dielectric layer is typically etched while employing a plasma etch method to form the selfaligned contact microelectronic structure while employing the silicon nitride etch stop layer as a plasma etch stop layer.

While the use and fabrication of self-aligned microelectronic structures, such as but not limited to self aligned contact microelectronic structures, within microelectronic fabrication is desirable in the art of microelectronic fabrication, the use and fabrication of self-aligned microelectronic structures, such as but not limited to self-aligned contact microelectronic structures, is not entirely without problems in the art of microelectronic fabrication. In that regard, it is often difficult to form self-aligned microelectronic structures, such as but not limited to self aligned contact microelectronic structures, with uniform and optimal etch properties within the art of microelectronic fabrication while employing plasma etch methods.

It is thus desirable within the art of microelectronic fabrication to provide plasma etch methods for forming, with uniform and optimal etch properties, self-aligned microelectronic structures within microelectronic fabrications, and more particularly self-aligned contact microelectronic structures within microelectronic fabrications, and yet more particularly dual damascene trench self aligned contact microelectronic structures within microelectronic fabrications.

It is towards the foregoing objects that the present invention is directed.

Various plasma etch methods have been disclosed in the art of microelectronic fabrication for forming self-aligned structures with desirable properties within the art of microelectronic fabrication.

For example, Spuler et al., in U.S. Pat. No. 5,935,873, discloses a plasma etch method for forming, while avoiding the use of a carbon monoxide etchant gas, a field effect transistor (FET) source/drain region self aligned contact microelectronic structure within a semiconductor integrated circuit microelectronic fabrication. To realize the foregoing object, the plasma etch method employs incorporating into a silicon nitride etch stop layer which encapsulates a pair of field effect transistor (FET) gate electrode structures within the semiconductor integrated circuit microelectronic fabrication, the silicon nitride etch stop layer in turn having formed thereupon a blanket silicon oxide dielectric layer passivating the silicon nitride etch stop layer and the pair of field effect transistor (FET) gate electrode structures, which silicon oxide dielectric layer is etched to form the field effect transistor (FET) self-aligned contact microelectronic structure within the semiconductor integrated circuit microelectronic fabrication, a quantity of carbon such that there may be avoided within an etchant gas composition employed within the plasma etch method the use of the carbon monoxide etchant gas in conjunction with an octafluorocyclobutane etchant gas, where the use of the carbon monoxide etchant gas would otherwise provide for enhanced selectivity for etching of the silicon oxide dielectric layer with respect to the silicon nitride etch stop layer.

In addition, Li et al., in U.S. Pat. No. 6,009,830, discloses a plasma etch method and a plasma etch apparatus wherein there may similarly also be reduced the use of a carbon monoxide etchant gas in conjunction with an octafluorocyclobutane etchant gas when forming, with enhanced uniformity, a field effect transistor (FET) source/drain region self aligned contact microelectronic structure through a silicon oxide dielectric layer which passivates a pair of field effect transistor (FET) gate electrode structures which are first encapsulated with a pair of silicon nitride etch stop layers within a semiconductor integrated circuit microelectronic fabrication, while employing the plasma etch method and the plasma etch apparatus. To realize the foregoing object, the plasma etch method and the plasma etch apparatus employ an introduction into a plasma reactor chamber of an inert carrier gas above the microelectronic fabrication when etching the microelectronic fabrication to form the field effect transistor (FET) source/drain region self aligned contact microelectronic structure and a simultaneous introduction into the reactor chamber of an active etchant gas composition from below the microelectronic fabrication when etching the microelectronic fabrication to form the field effect transistor source/drain region self-aligned contact microelectronic structure.

Desirable in the art of microelectronic fabrication are additional plasma etch methods and materials which may be employed for forming, with uniform and optimal etch properties, self-aligned microelectronic structures, such as but not limited to self-aligned contact microelectronic structures, further such as but not limited to dual-damascene trench self-aligned contact microelectronic structures, within microelectronic fabrications.

It is towards the foregoing objects that the present invention is directed.

SUMMARY OF THE INVENTION

A first object of the present invention is to provide a plasma etch method for forming, within a microelectronic fabrication, a self-aligned microelectronic structure.

A second object of the present invention is to provide a plasma etch method in accord with the first object of the present invention, wherein the plasma etch method is provided with uniform and optimal etch properties.

A third object of the present invention is to provide a plasma etch method in accord with the first object of the present invention and the second object of the present invention, which plasma etch method is readily commercially implemented.

In accord with the objects of the present invention, there is provided by the present invention a plasma etch method for forming a trench within a silicon oxide layer. To practice the method of the present invention, there is first provided a substrate. There is then formed over the substrate a silicon oxide layer. There is then formed over the silicon oxide layer a masking layer. There is then etched, while employing a plasma etch method in conjunction with the masking layer, the silicon oxide layer to form an etched silicon oxide layer defining a trench. Within the present invention, the plasma etch method employs an etchant gas composition comprising: (1) octafluorocyclobutane; and (2) at least one of carbon tetrafluoride, difluoroethylene, hexafluoroethane and oxygen; but excluding (3) a carbon and oxygen containing gas.

The present invention provides a plasma etch method which may be employed for forming within a microelectronic fabrication a self-aligned microelectronic structure within the microelectronic fabrication, wherein the plasma etch method is provided with uniform and optimal etch properties. The present invention realizes the foregoing objects by employing within a plasma etch method for etching within a silicon oxide layer a trench an etchant gas composition comprising: (1) octafluorocyclobutane; and (2) at least one of carbon tetrafluoride, difluoroethylene, hexafluoroethane and oxygen; but excluding (3) a carbon and oxygen containing gas.

The method of the present invention is readily commercially implemented. The present invention employs methods and materials as are generally known in the art of microelectronic fabrication, but employed in accord with a specific materials combination and process conditions to provide the present invention. Since it is thus specific materials combinations and process conditions which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a plasma etch method which may be employed for forming within a microelectronic fabrication a self-aligned microelectronic structure within the microelectronic fabrication, wherein the plasma etch method is provided with uniform and optimal etch properties. The present invention realizes the foregoing objects by employing within the plasma etch method for etching a trench within a silicon oxide layer an etchant gas composition comprising: (1) octafluorocyclobutane; and (2) at least one of carbon tetrafluoride, difluoroethylene, hexafluoroethane and oxygen; but excluding (3) a carbon and oxygen containing gas.

Although the present invention provides particular value within the context of forming with enhanced selectivity with respect to a silicon nitride etch stop layer, and with attenuated edge defect micro-trenches, a dual damascene trench self-aligned contact microelectronic structure employed within a microelectronic fabrication and more particularly within a semiconductor integrated circuit microelectronic fabrication, the present invention may be in general be employed for forming within silicon oxide layers trenches including but not limited to dual damascene trenches and non dual damascene trenches, with or without etch stop layers, with uniform and optimal etch properties, within microelectronic fabrications including but not limited to semiconductor integrated circuit microelectronic fabrications, ceramic substrate microelectronic fabrications, solar cell optoelectronic microelectronic fabrications, sensor image array optoelectronic microelectronic fabrications and display image array cptoelectronic microelectronic fabrications.

Figure 1:
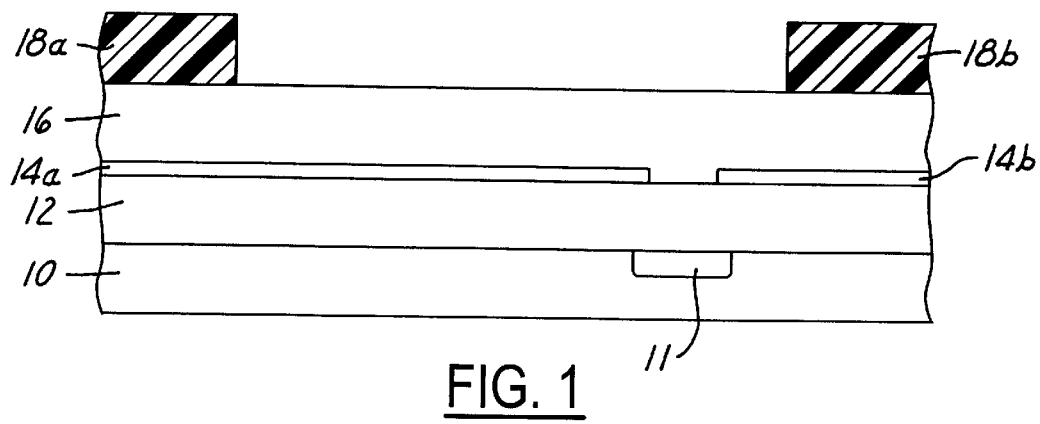
FIG. 1, FIG. 2 and FIG. 3 show a series of schematic cross-sectional diagrams illustrating edge defect microtrenching formed when forming a dual damascene trench self-aligned contact microelectronic structure within a microelectronic fabrication.
Figure 2:
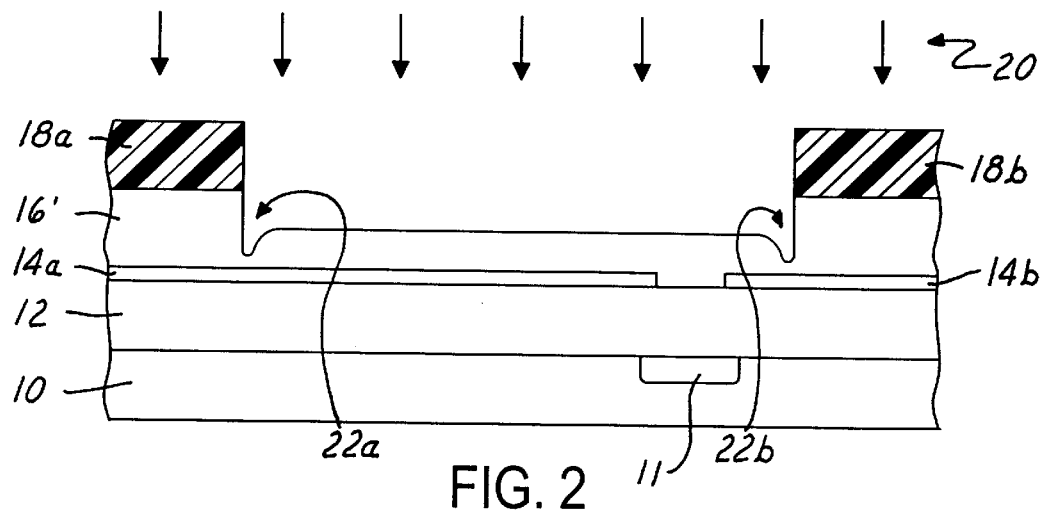
Figure 3:
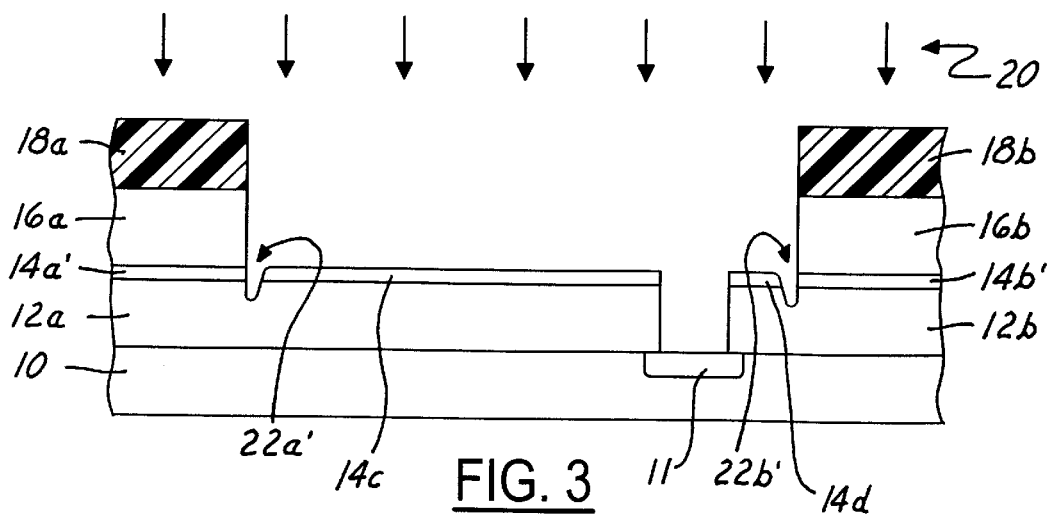

Referring now to FIG. 1 to FIG. 3, there is shown a series of schematic cross-sectional diagrams illustrating edge defect microtrenching formed, as observed within the context of the present invention, when forming a dual damascene trench self-aligned contact microelectronic structure within a microelectronic fabrication.

Shown in FIG. 1 is a schematic cross-sectional diagram of the microelectronic fabrication at an early stage in the fabrication therein of the dual damascene trench self-aligned contact microelectronic structure.

Shown in FIG. 1, in a first instance, is a substrate 10 having formed therein a contact region 11, wherein the substrate 10 having formed therein the contact region 11 in turn has formed thereupon a blanket first dielectric layer 12 separated from a blanket second dielectric layer 16 by a pair of patterned etch stop layers 14a and 14b. Finally, there is illustrated within the schematic cross-sectional diagram of FIG. 1 a pair of patterned photoresist layers 18a and 18b formed upon the blanket second dielectric layer 16 which further in part comprises the microelectronic fabrication.

While several additional details of various layers within the microelectronic fabrication whose schematic cross-sectional diagram is illustrated in FIG. 1 will be described in greater detail below within the context of the present invention, for the purpose of describing in detail the nature of the problem towards which the present invention is directed, within the microelectronic fabrication whose schematic cross-sectional diagram is illustrated in FIG. 1 both the blanket first dielectric layer 12 and the blanket second dielectric layer 16 are formed of a silicon oxide dielectric material and the pair of patterned etch stop layers 14a and 14b is formed of a silicon nitride etch stop material, although some other etch stop material may also be employed.

Similarly, as is understood by a person skilled in the art, and within the context of the microelectronic fabrication whose schematic cross-sectional diagram is illustrated in FIG. 1, there is desired to form through the blanket second dielectric layer 16 and the blanket first dielectric layer 12 a dual damascene trench self aligned contact microelectronic structure which exposes the contact region 11, while employing the pair of patterned etch stop layers 14a and 14b as a pair of plasma etch stop layers, and while similarly employing a plasma etch method which employs an appropriate etchant gas composition for etching the silicon oxide dielectric material from which is formed the blanket second dielectric layer 16 and the blanket first dielectric layer 12. Such a dual damascene trench self-aligned contact microelectronic structure comprises in effect: (1) a via which accesses the contact region 11, where the areal dimensions of the via are defined by an aperture formed in part by the pair of patterned etch stop layers 14a and 14b, along with (2) a trench contiguous with and overlapping the via, where the areal dimensions of the trench are defined by an aperture formed at least in part by the pair of patterned photoresist layers 18a and 18b. Although a schematic plan-view diagram is not provided, it is understood by a person skilled in the art that the via will often be of circular areal dimensions and the trench will often be of rectangular areal dimensions.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket second dielectric layer 16 has been etched to form an etched blanket second dielectric layer 16' while employing the pair of patterned photoresist layers 18a and 18b as a pair of etch mask layers, in conjunction with a first etching plasma 20. When forming the microelectronic fabrication whose schematic cross-sectional diagram is illustrated in FIG. 2 from the microelectronic fabrication whose schematic cross-sectional diagram is illustrated in FIG. 1, the first etching plasma 20 typically and preferably employs an etchant gas composition comprising octafluorocyclobutane, carbon monoxide and argon, wherein carbon monoxide is employed to provide enhanced etch selectivity characteristics and etch stop characteristics when the pair of patterned etch stop layers 14a and 14b is eventually reached. Typically and preferably, that plasma etch method which employs the etching plasma 20 also employs: (1) an octafluorocyclobutane flow rate of from about 5 to about 102 standard cubic centimeters per minute (sccm); (2) a carbon monoxide flow rate of from about 100 to about 250 standard cubic centimeters per minute (sccm); and (3) an argon flow rate of from about 100 to about 400 standard cubic centimeters per minute (sccm).

As is also illustrated within the schematic cross-sectional diagram of FIG. 2, there is shown a pair of edge defect micro-trenches 22a and 22b formed at a juncture of the sidewalls and the floor of a trench formed within the partially etched blanket second dielectric layer 16'. The pair of edge defect micro-trenches 22a and 22b is generally undesirable within the microelectronic fabrication whose schematic cross-sectional diagram is illustrated in FIG. 2, particularly for reasons as are better understood within the context of the microelectronic fabrication whose schematic cross-sectional diagram is illustrated in FIG. 3.

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the partially etched blanket second dielectric layer 16' has been completely etched to form a pair of patterned second dielectric layers 16a and 16b, while employing the pair of patterned photoresist layers 18a and 18b as a pair of plasma etch mask layers, and in conjunction with further use of the first etching plasma 20, to a point such that the pair of patterned etch stop layers 14a and 14b is reached and the blanket first dielectric layer 12 is then etched to provide a pair of patterned first dielectric layers 12a and 12b which define a via which accesses that contact region 11, and wherein the via is contiguous with the trench defined by the pair of patterned second dielectric layers 16a and 16b.

As is further understood by a person skilled in the art, as above, the via is of areal dimensions smaller than the trench and the via is contained within the floor of the trench, such that there may be formed a conductor stud layer within the via contiguous with a conductor interconnect layer formed within the trench while employing a single conductor layer deposition method followed by a single conductor layer chemical mechanical polish (CMP) planarizing method.

Unfortunately, as is also illustrated within the schematic cross-sectional diagram of FIG. 3, the pair of edge defect micro-trenches 22a and 22b as illustrated within the microelectronic fabrication whose schematic cross-sectional diagram is illustrated in FIG. 2 are extended to form a pair of extended edge defect micro-trenches 22a' and 22b' as illustrated within the schematic cross-sectional diagram of FIG. 3, wherein the pair of extended edge defect micro-trenches 22a' and 22b' as illustrated within the schematic cross-sectional diagram of FIG. 2 breach the pair of patterned etch stop layers 14a and 14b to form a series of twice patterned etch stop layers 14a', 14b', 14c and 14d.

Similarly with the pair of edge defect micro-trenches 22a and 22b as illustrated within microelectronic fabrication whose schematic cross-sectional diagram is illustrated in FIG. 2, the pair of extended edge defect micro-trenches 22a' and 22b' as illustrated within the microelectronic fabrication whose schematic cross-sectional diagram is illustrated in FIG. 3 are also undesirable in the art of microelectronic fabrication insofar as when forming a contiguous patterned conductor stud layer and patterned conductor interconnect layer within the via contiguous with the trench as illustrated within the schematic cross-sectional diagram of FIG. 3 there is typically formed a microelectronic fabrication with compromised functionality and/or reliability due to protrusions of the contiguous patterned conductor stud layer and patterned conductor interconnect layer at the locations of the pair of extended edge defect micro-trenches 22a' and 22b'.

It is thus towards the goal of forming a microelectronic fabrication analogous to the microelectronic fabrication whose schematic cross-sectional diagram is illustrated in FIG. 2 or FIG. 3, but absent the pair of first edge defect micro-trenches 22a and 22b as illustrated within the schematic cross-sectional diagram of FIG. 2, or the pair of extended edge defect micro-trenches 22a' and 22b' as illustrated within the schematic cross-sectional diagram of FIG. 3, that the present invention is directed.

Figure 4:
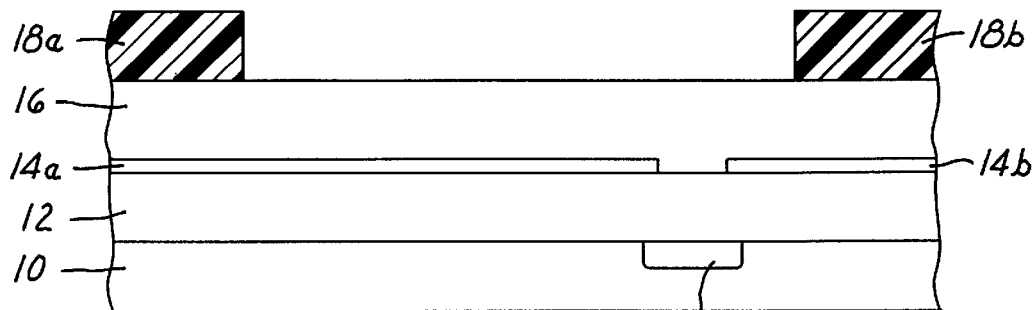
FIG. 4, FIG. 5 and FIG. 6 show a series of schematic cross-sectional diagrams illustrating the results of progressive stages in forming, in accord with a preferred embodiment of the present invention, a dual damascene trench self aligned contact microelectronic structure, absent edge defect micro-trenching.
Figure 5:
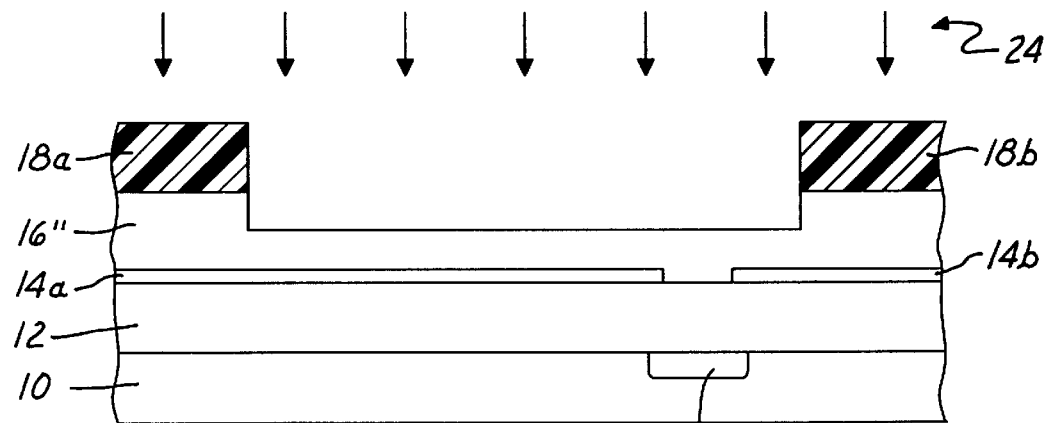
Figure 6:
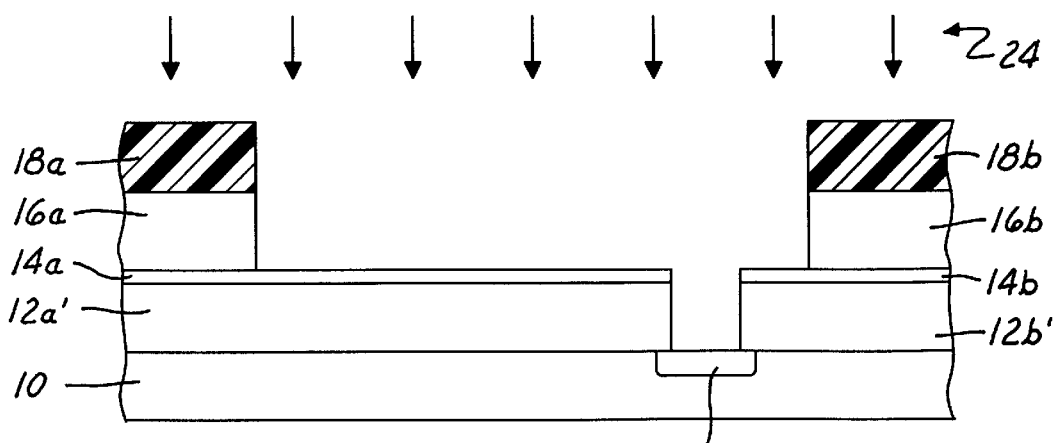

Referring now to FIG. 4 to FIG. 6, there is shown a series of schematic cross-sectional diagrams illustrating the results of progressive stages in forming, in accord with a preferred embodiment of the present invention, a dual damascene trench self-aligned contact microelectronic structure, absent edge defect micro-trenches.

Referring more particularly to FIG. 4, there is shown a schematic cross-sectional diagram of the microelectronic fabrication at an early stage in its fabrication.

As is understood by a person skilled in the art, the microelectronic fabrication whose schematic cross-sectional diagram is illustrated in FIG. 4 is identical to the microelectronic fabrication whose schematic cross-sectional diagram is illustrated in FIG. 1, with like layers and like structures also being numbered equivalently, and with additional details regarding the microelectronic layers and microelectronic structures within the microelectronic fabrication whose schematic cross-sectional diagram is illustrated in FIG. 1 and the microelectronic fabrication whose schematic cross-sectional diagram is illustrated in FIG. 4 being provided as follows.

With respect to the substrate 10 having formed therein the contact region 11, the substrate 10 having formed therein the contact region 11 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic fabrications.

Although not specifically illustrated within the schematic cross-sectional diagrams of FIG. 4 and FIG. 1, the substrate 10 having formed therein the contact region 11 may consist of a substrate also as employed within a microelectronic fabrication, or in an alternative, the substrate 10 having formed therein the contact region 11 may comprise a substrate as employed within the microelectronic fabrication, where the substrate has formed thereupon and/or thereover any of several additional microelectronic layers as are conventional within the microelectronic fabrication within which is employed the substrate. Similarly with the substrate alone as employed within the microelectronic fabrication, the additional microelectronic layers may be formed from microelectronic materials selected from the group including but not limited to microelectronic conductor materials, microelectronic semiconductor materials and microelectronic dielectric materials.

In addition, although also not specifically illustrated within the schematic cross-sectional diagram of FIG. 4, the substrate 10 having formed therein the contact region 11, typically and preferably, but not exclusively, when the substrate 10 having formed therein the contact region 11 consists of or comprises a semiconductor substrate employed within a semiconductor integrated circuit microelectronic fabrication, has formed therein and/or thereupon microelectronic devices as are conventional within the microelectronic fabrication within which is employed the substrate 10 having formed therein the contact region 11. Such microelectronic devices may include, but are not limited to resistors, transistors, diodes and capacitors.

Within the preferred embodiment of the present invention with respect to the contact region 11, the contact region 11 will typically and preferably be either a semiconductor contact region as employed most typically within a semiconductor integrated circuit microelectronic fabrication, or alternatively a conductor contact region as employed generally within any of several types of microelectronic fabrications, wherein the contact region 11 is typically and preferably formed of bidirectional i.e., areal) line width dimensions of from about 0.16 to about 4.0 microns within the substrate 10.

Shown also within the microelectronic fabrication whose schematic cross-sectional diagram is illustrated in FIG. 4, and corresponding with the microelectronic fabrication whose schematic cross-sectional diagram is illustrated in FIG. 1, is the blanket first dielectric layer 12 formed upon the substrate 10 having formed therein the contact region 11, wherein the blanket first dielectric layer 12 is separated from the blanket second dielectric layer 16 by the pair of patterned etch stop layers 14a and 14b.

As noted within the context of the description of the microelectronic fabrication whose schematic cross-sectional diagram is illustrated in FIG. 1, as above, each of the blanket first dielectric layer 12 and the blanket second dielectric layer 16 is formed of a silicon oxide dielectric material, while each of the pair of patterned etch stop layers 14a and 14b is preferably formed of a silicon nitride etch stop material, although other etch stop materials, which are typically dielectric etch stop materials, may also be employed. Within the preferred embodiment of the present invention with respect to the silicon oxide dielectric material from which is formed the blanket first dielectric layer 12 and the blanket second dielectric layer 16, the silicon oxide dielectric material from which is formed the blanket first dielectric layer 12 and the blanket second dielectric layer 16 may be a silicon oxide dielectric material formed employing methods including but not limited to chemical vapor deposition (CVD) methods, plasma enhanced chemical vapor deposition (PECVD) methods and spin-on-class (SOG) deposition methods. In addition, the blanket first dielectric layer 12 and the blanket second dielectric layer 16 need not necessarily be formed of a single silicon oxide dielectric material, although such is not precluded within the context of the present invention. Typically and preferably, the blanket first dielectric layer 12 is formed to a thickness of from about 6000 to about 13000 angstroms, while the blanket second dielectric layer 16 is formed to a thickness of from about 8000 to about 16000 angstroms.

In addition, within the preferred embodiment of the present invention with respect to the pair of patterned etch stop layers 14a and 14b preferably formed of the silicon nitride etch stop material, the silicon nitride etch stop material may be formed employing methods as are similarly conventional in the art of microelectronic fabrication, including but not limited to chemical vapor deposition (CVD) methods and plasma enhanced chemical vapor deposition (PECVD) methods. Typically and preferably, the pair of patterned etch stop layers 14a and 14b is formed to a thickness of from about 150 to about 300 angstroms to define an aperture typically and preferably having a bidirectional (i.e., areal) line width dimensions of from about 0.16 to about 4.0 microns. Typically and preferably there is not incorporated into the pair of patterned etch stop layers 14a and 14b any carbon or carbon containing material for purposes of enhancing etch selectivity.

Finally, there is shown within the microelectronic fabrication whose schematic cross-sectional diagram is illustrated in FIG. 4, as well as within the microelectronic fabrication whose schematic cross-sectional diagram is illustrated in FIG. 1, formed upon the blanket second dielectric layer 16 the pair of patterned photoresist layers 18a and 18b.

Within the preferred embodiment of the present invention, the pair of patterned photoresist layers 18a and 18b may be formed of photoresist materials as are conventional in the art of microelectronic fabrication, including photoresist materials selected from the general group of photoresist materials including but not limited to positive photoresist materials and negative photoresist materials. Typically and preferably, each of the pair of patterned photoresist layers 18a and 18b is formed to a thickness of from about 4900 to about 9700 angstroms.

Referring now to FIG. 5 and FIG. 6, there is shown a pair of schematic cross-sectional diagrams illustrating the results of further processing of the microelectronic fabrication whose schematic cross-sectional diagram is illustrated in FIG. 4.

Shown within the schematic cross-sectional diagrams of FIG. 5 and FIG. 6 is a pair of microelectronic fabrications which correspond generally with the pair of microelectronic fabrications whose schematic cross-sectional diagrams is illustrated in FIG. 2 and FIG. 3, but wherein instead of employing the first etching plasma 20 which comprises octafluorocyclobutane, carbon monoxide and argon, there is employed a second etching plasma 24 in accord with the present invention and the preferred embodiment of the present invention. Significant to the present invention, and in comparison within the context of the microelectronic fabrications whose schematic cross-sectional diagrams are illustrated in FIG. 2 and FIG. 3, by use of the second etching plasma 24 of the present invention instead of the first etching plasma 20 as illustrated within the schematic cross-sectional diagrams of FIG. 2 and FIG. 3, there is avoided: (1) formed within an etched blanket second dielectric layer 16" as illustrated within the schematic cross-sectional diagram of FIG. 5 a pair of edge defect micro-trenches 24a and 24b as illustrated within the etched blanket second dielectric layer 16' as illustrated within the schematic crosssectional diagram of FIG. 2; or (2) formed penetrating through the pair of patterned etch stop layers 14a and 14b as illustrated within the schematic cross-sectional diagram of FIG. 6 a pair of extended edge defect micro-trenches 24a' and 24b' as illustrated within the schematic cross-sectional diagram of FIG. 3 when forming a pair of patterned first dielectric layers 12a' and 12b' as illustrated within the schematic cross-sectional diagram of FIG. 6.

Within the preferred embodiment of the present invention with respect to the second etching plasma 24 which provides at least in part the present invention, the second etching plasma 24 employs an etchant gas composition comprising: (1) octafluorocyclobutane (i.e., $C_4F_8$); (2) at least one of carbon tetrafluoride (i.e., $CF_4$), difluoromethane (i.e., $CH_2F_2$), hexafluoroethane (i.e., $C_2F_6$) and oxygen (i.e., $O_2$); but without (3) a carbon and oxygen containing gas (such as but not limited to carbon monoxide and carbon dioxide (i.e., CO and $CO_2$), and typically and preferably also without argon (i.e., Ar). More typically and preferably, the second etching plasma 24 either consists essentially of or consists of: (1) octafluorocyclobutane; and (2) at least one of carbon tetrafluoride, difluoromethane, hexafluoroethane and oxygen; but without (3) a carbon and oxygen containing gas (such as but not limited to carbon monoxide and carbon dioxide) and typically and preferably also without argon or another diluent gas. Within the context of the present invention, the limitation "without the carbon and oxygen containing gas" is intended to indicate that no carbon and oxygen containing gas whatsoever is employed as a source gas within the etchant composition.

Within the preferred embodiment of the present invention there are three specific etchant gas compositions which have been found to be particularly desirable within the context of the present invention and the preferred embodiment of the present invention for avoiding edge defect micro-trenches when forming a dual damascene self-aligned contact microelectronic structure as illustrated within the schematic cross-sectional diagram of FIG. 6. The three etchant gas compositions comprise (or alternatively consist essentially of or yet alternatively consist of): (1) octafluorocyclobutane (with a flow rate of from about 5 to about 20, more preferably from about 6 to about 15 and most preferably from about 8 to about 12 standard cubic centimeters per minute (sccm)) and carbon tetrafluoride (with a flow rate of from about 10 to about 40, more preferably from about 15 to about 30 and most preferably from about 16 to about 25 standard cubic centimeters per minute (sccm); (2) octafluorocyclobutane (with a flow rate of from about 5 to about 20, more preferably from about 6 to about 15 and most preferably from about 8 to about 12 standard cubic centimeters per minute (sccm)), difluoromethane (with a flow rate of from about 3 to about 20, more preferably from about 5 to about 15 and most preferably from about 8 to about 10 standard cubic centimeters per minute (sccm)) and hexafluoroethane (with a flow rate of from about 3 to about 20, more preferably from about 5 to about 15 and most preferably from about 8 to about 10 standard cubic centimeters per minute (sccm)); and (3) octafluorocyclobutane (with a flow rate of from about 5 to about 20, more preferably from about 6 to about 15 and most preferably from about 8 to about 12 standard cubic centimeters per minute (sccm)) and oxygen (with a flow rate of from about 2 to about 10, more preferably from about 3 to about 8 and most preferably from about 4 to about 6 standard cubic centimeters per minute (sccm)). Of the above three options, the second is the most preferred.

While employing any one of the above three preferred compositions for an etchant gas composition within the second etching plasma 24 in accord with the present invention and the preferred embodiment of the present invention, there is typically and preferably also employed: (1) a reactor chamber pressure of from about 30 to about 50 mtorr; (2) a source radio frequency power of from about 1200 to about 1500 watts and a bias power of from about 500 to about 1200 watts; (3) a substrate temperature of from about 40 to about 60 degrees centigrade.

Upon forming the microelectronic fabrication whose schematic cross-sectional diagram is illustrated in FIG. 6, there is formed a microelectronic fabrication in accord with the preferred embodiment of the present invention. The microelectronic fabrication fabricated in accord with the preferred embodiment of the present invention has formed therein a dual damascene trench self-aligned contact microelectronic structure formed therein with uniform and optimal etch properties and absent defects such as but not limited to edge defect micro-trenches.

The foregoing objects and results are realized within the context of the present invention by employing when forming the dual damascene trench self-aligned contact microelectronic structure, and more specifically within an etching plasma employed when forming the dual damascene trench self-aligned contact microelectronic structure, any one of several novel etchant gas compositions, absent carbon monoxide, in accord with the present invention and the preferred embodiments of the present invention. similarly, such results are also achieved within the context of the present invention when forming a dual damascene trench self-aligned contact microelectronic structure which is bounded by an etch stop layer, even absent incorporation into the etch stop layer of carbon to promote selective etching of the dual damascene trench selfaligned contact microelectronic structure with respect to the etch stop layer.

As is understood by a person skilled in the art, the preferred embodiments of the present invention are illustrative of the present invention rather than limiting of the present invention. Revisions and modifications may be made to materials, structures and dimensions which are employed within the preferred embodiments of the present invention, to still provide a method in accord with the present invention, further in accord with the accompanying claims.

What is claimed is:

1. A method for etching a trench within a silicon oxide layer comprising:

providing a substrate;

forming over the substrate a silicon oxide layer;

forming over the silicon oxide layer a masking layer;

etching, while employing a plasma etch method in conjunction with the masking layer as an etch mask layer, the silicon oxide layer to form an etched silicon oxide layer defining a trench, the plasma etch method employing an etchant gas composition comprising:
octafluorocyclobutane; and
at least one of carbon tetrafluoride, difluoromethane, hexafluoroethane and oxygen; but excluding a carbon and oxygen containing gas such that the trench is formed with inhibited edge defects.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the carbon and oxygen containing gas is selected from the group consisting of carbon to monoxide and carbon dioxide.

4. The method of claim 1 wherein the etchant gas composition further excludes argon.

5. The method of claim 1 wherein the etchant gas composition comprises octafluorocyclobutane and carbon tetrafluoride.

6. The method of claim 5 wherein:

octafluorocyclobutane is provided at a flow rate of from about 8 to about 12 standard cubic centimeters per minute (sccm); and carbon tetrafluoride is provided at a flow rate of from about 5 to about 10 standard cubic centimeters per minute (sccm).

7. The method of claim 1 wherein the etchant gas composition comprises octafluorocyclobutane, difluoromethane and hexafluoroethane.

8. The method of claim 7 wherein:

octafluorocyclobutane is provided at a flow rate of about 8 to about 12 standard cubic centimeters per minute (sccm);

difluoromethane is provided at a flow rate of about 5 to about 10 standard cubic centimeters per minute (sccm); and hexafluoroethane is provided at a flow rate of about 5 to about 10 standard cubic centimeters per minute (sccm).

9. The method of claim 1 wherein the etchant gas composition comprises octafluorocyclobutane and oxygen.

10. The method of claim 9 wherein:

octafluorocyclobutane is provided at a flow rate of from about 8 to about 12 standard cubic centimeters per minute (sccm); and oxygen is provided at a flow rate of from about 4 to about 6 standard cubic centimeter per minute.

11. The method of claim 1 wherein the trench is bounded by an etch stop layer when forming the trench.

12. The method of claim 11 wherein the etch stop layer does not have incorporated therein carbon.

13. The method of claim 1 wherein the trench is not bounded by an etch stop layer when forming the trench.

14. The method of claim 1 wherein the trench is a dual damascene trench.

* * * * *